United States Patent [19]
Voth

[11] Patent Number: 5,638,028
[45] Date of Patent: Jun. 10, 1997

[54] CIRCUIT FOR GENERATING A LOW POWER CPU CLOCK SIGNAL

[75] Inventor: David W. Voth, Woodinville, Wash.

[73] Assignee: Microsoft Corporation, Redmond, Wash.

[21] Appl. No.: 541,207

[22] Filed: Oct. 12, 1995

[51] Int. Cl.⁶ .................. H03L 7/06; H03L 7/18
[52] U.S. Cl. .................. 331/25; 331/2; 331/34; 331/57; 327/105; 327/145; 327/146; 327/151
[58] Field of Search .................. 331/1 R, 2, 14, 331/25, 34, 49, 57, 173; 327/105, 107, 156, 158, 159, 144–146, 151–153, 155, 160–162

[56] References Cited

U.S. PATENT DOCUMENTS

| | | | |
|---|---|---|---|
| 4,816,776 | 3/1989 | Kessler | 331/49 |
| 5,063,357 | 11/1991 | Williams et al. | 331/49 |
| 5,075,640 | 12/1991 | Miyazawa | 331/10 |
| 5,315,271 | 5/1994 | Pascual et al. | 331/57 X |
| 5,389,898 | 2/1995 | Taketoshi et al. | 331/49 X |
| 5,406,231 | 4/1995 | Jylha | 331/49 |

Primary Examiner—David Mis
Attorney, Agent, or Firm—Leydig, Voit & Mayer, Ltd.

[57] ABSTRACT

A circuit for generating a low power CPU clock signal is disclosed. The circuit includes a multi-frequency oscillator having a plurality of output signals of various frequencies that are input to a signal selector. The signal selector is controlled to route one of the various frequency signals to the output, which provides the CPU clock oscillating signal. The frequency of the CPU clock signal is compared against a reference oscillatory signal that is generated by a reference oscillator. Based upon the comparison, the frequency comparator generates an output signal that is used to control the signal selector to select an input signal of either higher or lower frequency, depending upon the comparison. Finally, an enable signal is provided for selectively enabling the operation of the CPU clock oscillating circuit.

10 Claims, 5 Drawing Sheets

CIRCUIT FOR GENERATING A LOW POWER CPU CLOCK SIGNAL

BACKGROUND OF THE INVENTION

1. Field of the Art

The present invention generally relates to oscillator circuits, and more particularly to an oscillator circuit for providing a CPU clock oscillator signal.

2. Discussion of the Related Art

In recent years, the advancement of integrated circuit technology has precipitated the proliferation of a wide variety of hand held and portable computing devices. For example, laptop and notebook computers are known which possess tremendous processing speed and capability, and can quite easily fit in a briefcase for convenient transport to remote work sites. Indeed, business people frequently tote computers along for work at home or during travel. Even smaller devices, such as pocket-sized electronic organizers and calculators are designed with tremendous processing capabilities and are sized to readily fit in a suit breast pocket, for example. Calculators, designed for scientific as well as business disciplines are capable of processing exceeding sophisticated mathematical equations, and are widely used by both students and professionals. Pocket-sized electronic organizers have become increasingly popular as a surrogate to daily planners and are generally designed to maintain scheduling information, to-do lists, telephone directories, etc.

While the above-listed portable electronic devices may differ vastly in their relative designs and functional capabilities, a salient design feature shared among them all is portability and, therefore, the ability to operate from battery power. In this regard, the battery is a limited resource which defines the usable or work life of the device. Under normal use, battery packs for portable computers generally last for several hours, while the batteries in hand-held calculators and electronic organizers generally last for several months.

It can be appreciated that an important feature of portable electronic devices is their ability to operate from very low power and, therefore, conserve battery life. A variety of approaches and design configurations are presently known that seek to achieve this goal. For example, laptop computers having a permanent disk drive will typically power-down the drive when it is not in use, due to the relatively large power requirements of the drive motor. While this degrades the performance of the computer when the permanent drive needs to be accessed (due to the time required to bring the drive up to speed), it substantially lengthens the work life of the battery pack, since disk access is usually infrequent. Another technique that is used to preserve battery life in portable computers, pocket organizers, and other small electronic devices that utilize a CPU, is to invoke what is commonly referred to as a "sleep" state, when the CPU becomes inactive.

More specifically, and as understood by persons skilled in the art, a CPU (e.g., microprocessor, microcontroller, etc.) is often inactive, insofar as no useful computations are presently being carried out for the user. For example, in an application where a portable computing device is waiting for a user to enter a keystroke, the CPU may be executing delay instructions in an infinite loop or, alternatively, the CPU may be waiting for an interrupt. In situations like this, it is desirable to place the CPU in a "sleep" state, whereby sufficient power is provided to the CPU to maintain the integrity of the data stored in its internal registers, but the power is otherwise conserved by halting other activity. Thus, a CPU is often designed to operate in a "normally active" state as well as a "sleep" state of operation. Frequently, and for reasons described below, the sleep state of operation is further subdivided into two separate states of operation. A first, or "low power" state, is provided in which the CPU is substantially shut down, except for the CPU oscillator circuit portion. In the second, or "off" state, the entire CPU, including the oscillator circuit portion, is shut down.

It is known to use a device known as a phase locked loop to provide internal CPU clock signals. In such devices, an external oscillator signal is input to the phase locked loop, which can be configured to provide a coherent (i.e., in-phase or synchronous) output signal having a much higher frequency. As is known, a voltage controlled oscillator lies at the heart of a phase locked loop, and provides an oscillatory output signal that increases in frequency as the magnitude of the voltage input increases. By feeding the oscillatory signal output from the voltage controlled oscillator and the external oscillatory signal into a multiplier—the output of which is input to the voltage controlled oscillator—it is known that the output of the voltage controlled oscillator will "synch-up" with the oscillatory input signal. However, there is usually some delay period associated with this initial synchronization. When output of the voltage controlled oscillator is passed through a frequency divider before being routed to the multiplier, the output of the frequency divider, instead of the phase locked loop, will synch-up with the oscillatory input signal. As a result, the output of the phase locked loop will be an oscillating signal of much higher frequency than the signal input. Accordingly, the parameters of the divider circuitry dictate the frequency increase achieved by the phase locked loop oscillator circuitry.

While the phase locked loop circuitry described above realizes certain performance advantages, (i.e., precise synchronization of the CPU clock with the external bus clock), there are shortcomings associated with this approach. For example, it is known that phase locked loop devices are analog devices, and typically consume more power than counterpart digital devices. In an environment where power conservation is critical, it is appreciated that the use of analog circuitry unduly consumes battery resources. It is, therefore, desired to shut down the phase locked loop clock oscillator, (i.e., from the "low power" mode to the "off" mode). However, when transferring from the "off" mode to the normally-active mode, an excessive amount of time is required in order to bring the CPU clock speed up to its stable state. That is, an excessive amount of time is required to synch-up the output of the phase locked loop.

As previously mentioned, CPU oscillator circuits generally provide two separate "sleep" states of operation. In the first, or "low power" state, the CPU oscillator circuit portion is operating normally, while the remainder of the CPU is shut down. A second, or "off" sleep state, is provided in which the entire CPU, including the oscillator circuit portion, is shut down. On the one hand and in order to achieve maximum power conservation, it is desired to enter the "off" state whenever possible. On the other hand, however, when excessively entering and leaving the "off" state, significant performance diminution is noted, due to the time required for the phase locked loop to synch-up. Importantly, the time expended during the "synch-up" period accounts for significant power consumption, particularly when the oscillator circuit is repeatedly turned on and off. Accordingly, the CPU must be designed with sufficient "intelligence" to determine when to enter the low power state and when to enter the off state.

This "intelligence" may be rather simply provided by way of a time-out. That is, the CPU may be normally configured to enter a low power sleep state and, upon entering that state, begin a timer. After a time-out of a predetermined period of time, if the CPU has not been awakened from the sleep state to operate in the normally active state, then the CPU will be transferred to the off state. Alternatively, more sophisticated "intelligence" may be designed into the CPU, whereby the CPU analyzes the sequence of instructions executed just prior to entering a sleep state. It may be learned that certain instructions executed just prior to entering in a sleep state are typically associated with a very long inactive period, whereby the oscillator circuitry should be shut down. In instances such as these, it would be desirable to have the CPU anticipate the long sleep state and directly enter the off state, without awaiting a time-out. It can be understood, however, that this approach would unduly increase the complexity of the CPU.

It can therefore be appreciated that there is need to provide an oscillator circuit for generating an internal CPU clock that operates at low power when active and, at the same time, may be transferred between sleep and active states in a relatively short period of time.

SUMMARY OF THE INVENTION

Accordingly, it is a primary aim of the present invention to provide an oscillator circuit for a central processing unit that operates at extremely low power.

Another object of the present invention is to provide an oscillator circuit for generating a CPU clock which may be transferred between active and sleep states in a very short period of time.

Additional objects, advantages and other novel features of the invention will be set forth in the detailed description that follows with reference to the accompanying drawings and will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects, the present invention is generally directed to a circuit for generating a low power CPU clock signal. A multi-frequency oscillator is provided and configured to generate a plurality of output signals of varying frequencies. A signal selector is disposed to receive the output signals of the multi-frequency oscillator, and is operative to pass one of these input signals through to the output, based upon a select signal, wherein the signal output from the signal selector comprises the CPU clock signal. A reference oscillator having an oscillatory output signal is also provided. A frequency comparator is disposed to receive both the output from the signal selector and the output from the reference oscillator, and is operative to compare the two signals and generate an output signal that is responsive to the difference between the frequencies of the two signals. The output of the frequency comparator, in turn, is used to control the signal selector. Finally, an enable signal is provided for selectively enabling and disabling the operation of the CPU oscillator circuit. In this way, and depending upon the parameters of the frequency comparator, a low-power CPU clock signal may be generated and is related to a reference oscillator signal.

A significant aspect of the present invention relates to the reduced power consumption achieved by the 5 extremely fast "synch-up" or start-up time. In contrast to the phase locked loop circuits known to require a definite period of time to "synch-up" to an external reference oscillator, the all digital circuitry preferably utilized in the present invention provides a virtually instantaneous start-up, whereby the output oscillatory signal is synchronized with a reference oscillator. Due to this fast start-up, a significant power savings in achieved, particularly in applications that repeatedly toggle the CPU oscillator on and off.

BRIEF DESCRIPTION OF THE DRAWINGS

The accompanying drawings incorporated in and forming a part of the specification, illustrate several aspects of the present invention, and together with the description serve to explain the principles of the invention. In the drawings.

Reference will now be made in detail to various present preferred embodiments of the invention, examples of which are illustrated in the accompanying drawings. While the invention will be described in connection with these embodiments, there is no intent to limit it to these embodiments. On the contrary, the intent is to cover all alternatives, modifications and equivalents included within the spirit and scope of the invention as defined by the appended claims.

DETAILED DESCRIPTION OF THE PREFERRED EMBODIMENT

Figure 1:
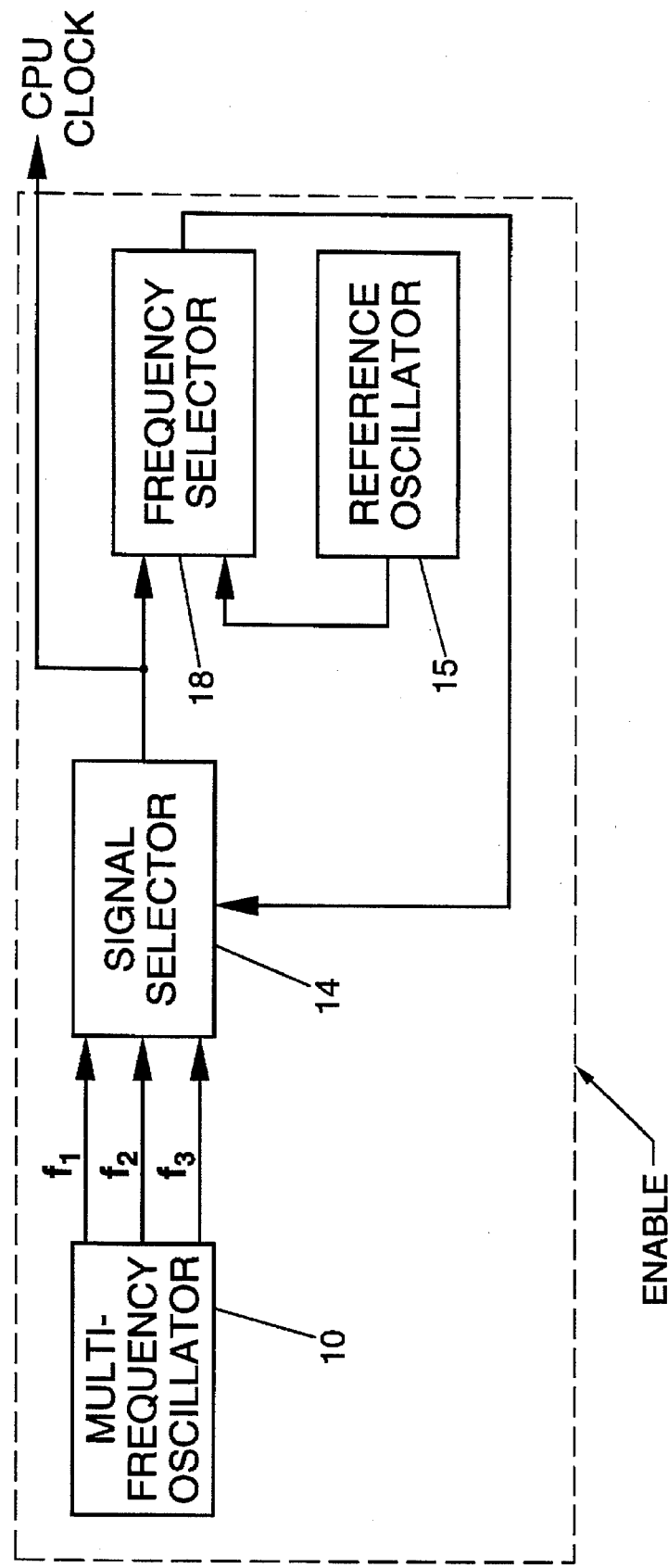
FIG. 1 is a block diagram illustrating the primary component of the preferred CPU oscillator circuit.

Referring now to the drawings, FIG. 1 is a block diagram showing the principal elements of the present invention. A multi-frequency oscillator 10 is configured to generate a plurality of oscillatory output signals of various frequencies. In FIG. 1, three output signals are illustrated, having oscillatory frequencies denoted as $f_1$, $f_2$, and $f_3$. It will become clear from the discussion that follows that additional oscillatory output signals may be included. Indeed, three signals have been chosen, in part, to simplify the description and therefore better illustrate the concepts of the present invention.

The oscillatory signals output from the multi-frequency oscillator 10 are input to a signal selector 14. The signal selector 14 is controlled to "select" one of the oscillatory signals $f_1$, $f_2$, or $f_3$, as the CPU clock signal. In this regard, the signal selector 14 simply passes through to its output the particular oscillatory signal selected.

As is well known, and as previously described, many computing devices operate with a CPU having an internal clock frequency that is much faster than an external, bus clock. Indeed, many such systems derive the CPU clock from the external bus clock, so that the clock signals are coherent, or in phase, wherein the a CPU clock signal will be rising or falling coincident with each rising and falling edge of the bus clock. This is sometimes advantageous when the CPU is communicating with external devices. For example, when data is read from or stored to memory, it is transferred between external memory chips and internal registers within the CPU. It is often advantageous to have the CPU clock and bus clock "in sync," since the CPU generates the appropriate handshaking signals for making such transfers. However, it can be appreciated that in many systems, particularly systems in which the CPU clock is oscillating much faster than the bus clock, the clocks need not be in precise synchronization. Instead, it may be sufficient to wait one or more CPU clock cycles after a bus clock transition, before communicating between a CPU register and the system bus. The present invention is directed to these types of systems.

In keeping with the description of the preferred embodiment, a reference oscillator 15 is shown and broadly represents some source for generating an oscillatory signal. It is contemplated that the reference oscillator 15 may be the external bus clock oscillator. Alternatively, it may be a time of day oscillator. Systems that maintain the time and date include an internal clock dedicated for achieving this function. Associated with this internal system is a time of day oscillator which typically operates off a quartz crystal of the same type that is used in wrist watches, oscillating at approximately 32.768 Khz. Nevertheless, for purposes of the present invention, the reference oscillator 15 is some a source for generating or maintaining a stable and consistent oscillatory signal.

The CPU clock signal and the output signal of the reference oscillator 15 are both input into a frequency selector 18. The frequency selector 18 compares the two signals and generates an output signal that is used to control the signal selector 14. As will be further described below, the frequency selector 18 may be configured to control the signal selector 14 so that the CPU clock closely tracks the output frequency of the reference 15. Alternatively, the frequency selector 18 may be configured to control the signal selector 14 so that the CPU clock is operating at a frequency many times greater than the frequency of the output of the reference oscillator 15.

Finally, an enable signal 19 is shown as generally associated with the oscillator circuit, but not specifically associated or connected with any particular component of the oscillator circuit. It can be appreciated that the enable signal 19 may be configured in a number of ways to enable or disable the CPU clock oscillator circuit. For example, it may be input along with the CPU clock signal to an AND gate (not shown). In this way, the CPU clock would be disabled when the enable signal 19 is a logic "zero" and enabled when the enable signal 19 is a logic "1." This approach, however, would allow the internal components of the CPU clock oscillator to function normally, disabling only the output signal. It may, alternatively, be desired to connect the enable signal 19 with several of the internal components, thereby disabling the entire circuit operation. This latter approach is preferred as it would more fully achieve the low-power consumption objectives of the present invention. Indeed, disabling the circuit in this way provides further power savings than merely disabling the CPU clock signal. In addition, a number of integrated circuit devices support this latter approach by providing signal lines that may be used to enable or disable the operation of a particular component.

Figure 2:
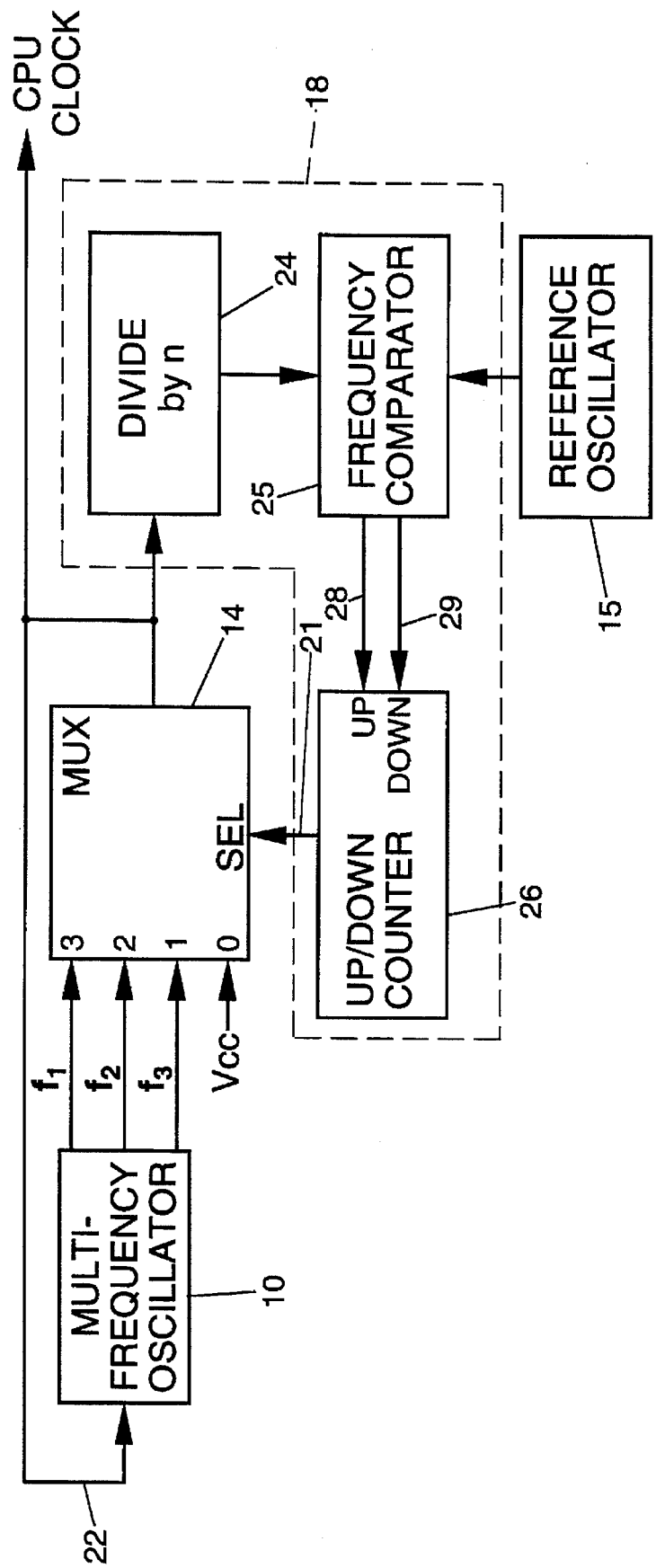
FIG. 2 is a block diagram illustrating in more detail the preferred oscillator circuit shown in FIG. 1.

Referring now to FIG. 2, a block diagram of the preferred embodiment of the present invention is shown. In this illustration, the signal selector 14 of FIG. 1, is more specifically shown as a multiplexer 20. When utilizing a multiplexer in this way, the select lines 21 are controlled to determine which input frequency $f_1$, $f_2$, or $f_3$ is routed to the output. Multiplexers typically have a number of inputs, which are some power of 2 (i.e., 2, 4, 8, etc.). Since the illustrated embodiment shows three frequencies output from the multi-frequency oscillator 10, a fourth input to the multiplexer 20 is shown and denoted as VCC. In this embodiment, and as will be understood by the description that follows, it may be desired to use the enable signal in connection with the select lines 21 to select the non-oscillatory VCC input when the clock oscillator circuit is disabled. As illustrated in this figure in connection with the multiplexer 20, the CPU clock signal output from the multiplexer 20 is fed back at 22 as an input to the multi-frequency oscillator 10. It may, alternatively, be desired to selectively feed back one of the signals of varying frequency from the multi-frequency oscillator 10, rather than the output of multiplexer 20.

As mentioned in connection with FIG. 1, the frequency selector 18 (shown in fantom line) may be configured to generate a CPU clock signal that is many times greater in frequency than the output of the reference oscillator 15. Therefore a divider circuit 24 is provided and is operative to receive the output of the multiplexer 20 and frequency divide that signal to generate an output signal for the frequency comparator 25 that is much closer in frequency to the signal output by the reference oscillator 15. The frequency comparator 25 then compares these two signals to control an up/down counter 26. The up/down counter 26, in turn, generates the select lines 21 for control of the multiplexer 20.

To more particularly describe the operation of this circuitry, assume that frequency $f_1$ is less than the frequency $f_2$, which is less than frequency $f_3$, output from the multi-frequency oscillator 10. Further assume that the CPU clock is presently operating at frequency $f_2$. Based on the comparison by frequency comparator 25, if it is desired to decrease the frequency of the CPU clock, the frequency comparator 25 will control the signal on line 28 to cause counter 26 to increment its count by 1. This changes the select lines from a count of 2 to a count of 3, thereby selecting frequency $f_1$ to be output from multiplexer 20 as the CPU clock. Conversely, if it is desired to increase the frequency of the CPU clock, based on the frequency comparison, the frequency comparator 25 will control the signal on line 29 to cause the counter 26 to decrement and thereby decrease the count on select lines 21. This then changes the count on select lines 21 from 2 to 1 and, accordingly, selects frequency $f_3$ as the CPU clock.

Figure 3A:
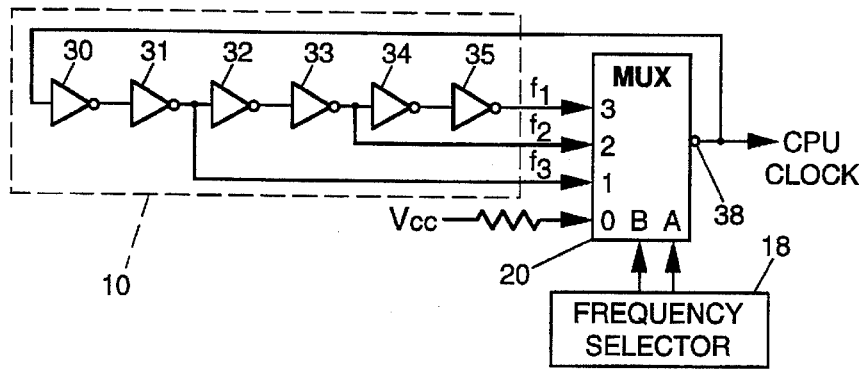
FIGS. 3A–3C illustrate alternative embodiments of the multi-frequency oscillator of the present invention.
Figure 3B:
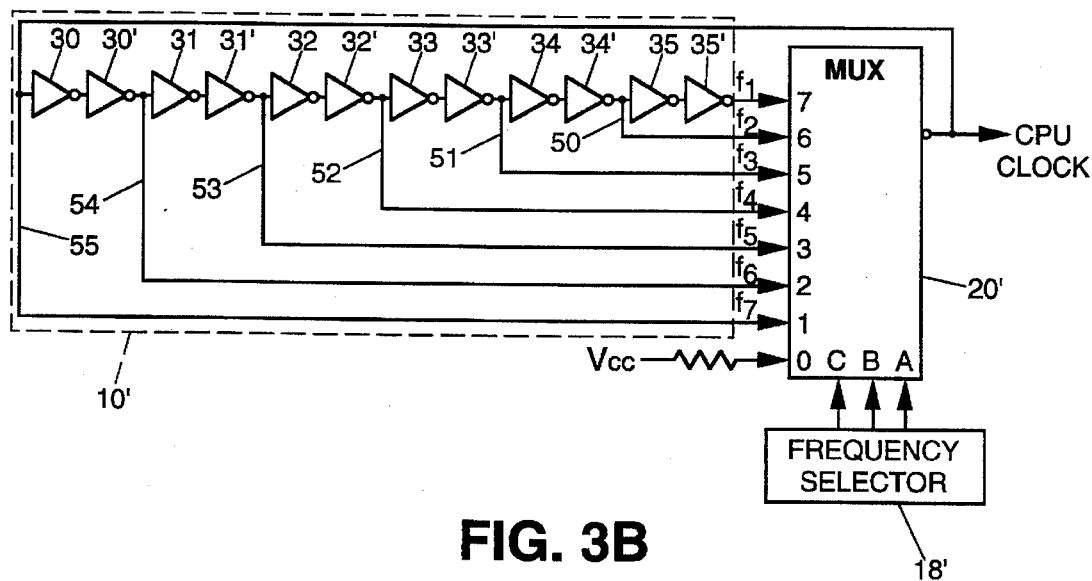
Figure 3C:
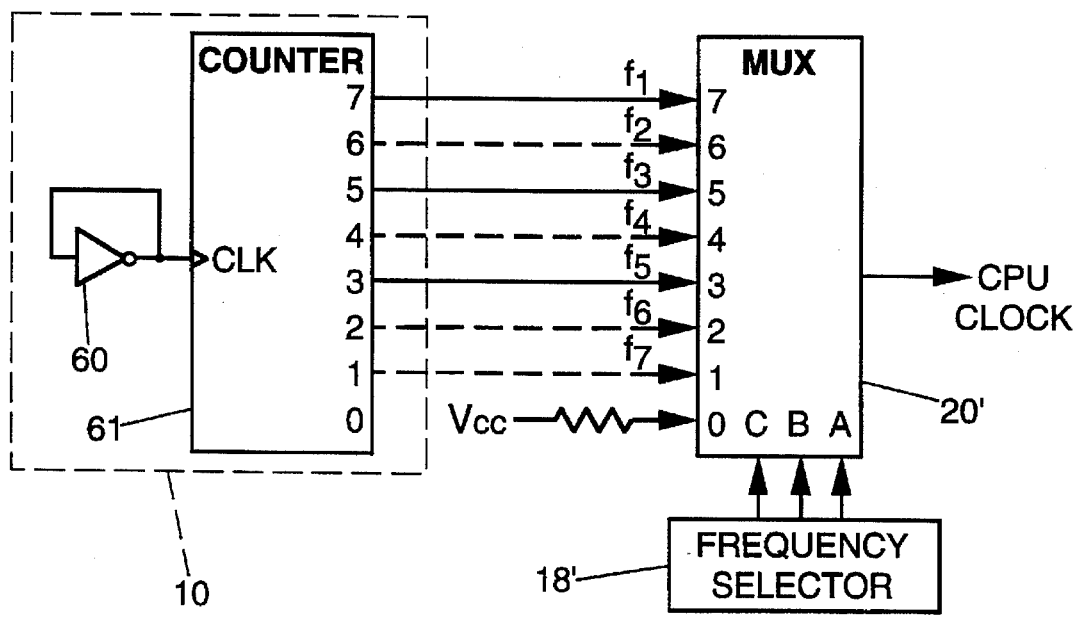

Turning now to FIGS. 3A-3C, various preferred embodiments of the multifrequency oscillator 10 and multiplexer 20 are shown. FIG. 3A shows the multifrequency oscillator as comprising a series connected string of invertors 30-35. As is known, an invertor is a digital device that produces an output of opposite polarity than the input. If the input is a logic "0" then the output would be a logic "1", and if the input were a logic "1", the output would be a logic "0". The series connection, or cascade, of invertors as depicted results in a "toggling" of the various output signals. Feeding the output of the multiplexer 20 back to the input of invertor 30 results in a continuous change of states among the invertors. This, of course, assumes an odd number of invertors in the closed-loop series. Suppose, for example, that the input to invertor 30 is a logic 1. Tracing through the series string of invertors, it is understood that the output of invertor 35 is also a logic 1. Assuming further that the multiplexer is selected to pass input 3 ($f_1$) through to the output, then the output of the multiplexer 20 that is fed back to invertor 30 would become a logic 0, since the particular multiplexer illustrated is an inverting multiplexer (denoted by inverting bubble 38).

The input of invertor 30, now being a logic 0, will propagate this change of state throughout the string of invertors 30-35 and through multiplexer 20, causing the output of the multiplexer 20 to change back to a logic 1. Accordingly, this provides the oscillation to the output CPU clock signal. It can be appreciated that the frequency of the oscillation is determined by the propagation delay of the individual series connected devices. As is known, each individual device, such as invertor 30, has an inherent propagation delay: the propagation delay being the time required for the output signal to change state in response to the input signal. In the case of an invertor, the propagation delay would be the time required for the output to change from a logic low to a logic high following a change from a logic high to a logic low on the input signal. Propagation delays vary among device families. For example, a typical propagation delay for a CMOS device might be 100 nanoseconds. However, TTL devices have much higher propagation delays. Similarly, the device semiconductor material also effects the propagation delay times. Gallium arsenide devices, for example, have much lower propagation delays than silicon devices. The specific propagation delays for devices are published in data sheets which are readily accessible and will be appreciated by those skilled in the art.

In keeping with the description of FIG. 3A, signal taps 40 and 41 are provided along the series connection of invertors and routed to the input of multiplexer 20. In view of the above-described propagation delays, when multiplexer input "3" ($f_1$) is selected, the CPU clock is oscillating at its lowest frequency. When, however, multiplexer input "2" ($f_2$) is selected the signal path is now formed by invertors 30–33 and multiplexer 20, and invertors 34 and 35 are no longer in the closed-looped signal path. This reduces the total propagation delay along the closed loop of devices and therefore increases the CPU clock frequency. Similarly, when multiplexer input "1" ($f_3$) is selected, the closed-loop path comprises invertors 30 and 31 and multiplexer 20. This results in a CPU clock oscillation of highest frequency.

Referring now to FIG. 3B, an alternative to the embodiment shown in FIG. 3A, is shown. This embodiment illustrates a multi-frequency oscillator 10' (shown in fantom) having 7 oscillatory output signals of varying frequency, $f_1$–$f_7$. In this embodiment, taps 50–55 provide a greater number of oscillatory output signals for selection by multiplexer 20'. As in FIG. 3A, the invertors are grouped in pairs (e.g., 30 and 30' between signal taps 50–55, since there must be an odd number of invertors in any given closed loop path, in order to generate an oscillatory signal.

Referring now to FIG. 3C, yet another embodiment of the multi-frequency oscillator is shown. In this embodiment, a single invertor 60 is configured to feed back upon itself. As is known, this produces a very high frequency oscillatory signal: the frequency being determined by the propagation delay of the invertor. This high speed oscillatory signal is input as a clock signal to counter 61. In response, the output of the counter 61 will increment by one for each oscillation produced by invertor 60. The counter 61 is illustrated as an 8-bit binary counter, and therefore the output will count from 0 to 255 (all eight output bits equal to logic 1), and will roll-over (i.e., all output signals change from logic 1 to logic 0) to repeat this counting sequence indefinitely. In this configuration, each of the counter output signals is an oscillatory signal having a frequency that is some binary division of the frequency of invertor 60. For example, the frequency of the output signal at bit 0 (assuming bit 0 is the least significant bit) is one-half the frequency of the oscillating invertor 60. Similarly, the frequency of output bit 1 is one-fourth the frequency of the oscillating invertor 60. The output of the counter 61, therefore, provides multiple output oscillating signals from the multi-frequency oscillator 10. It is noted that three of the signals output from the counter 61 are shown in solid line, while the remainder are shown in fantom. This is merely to illustrate that this counter embodiment may be used to provide three signals of varying frequency to the multiplexer 20, as well as seven. Counters 61 may be cascaded to provide even more oscillatory signals to the multiplexer 20. The above-described embodiments have been chosen to provide a sampling of differing embodiments that may be implemented for the multi-frequency invertor 10. Indeed, it can be appreciated that there is a wide variety of circuit configurations (in addition to those described above) that can be utilized to achieve the functionality of the multi-frequency oscillator 10, consistent with the concepts of the present invention.

Figure 4A:
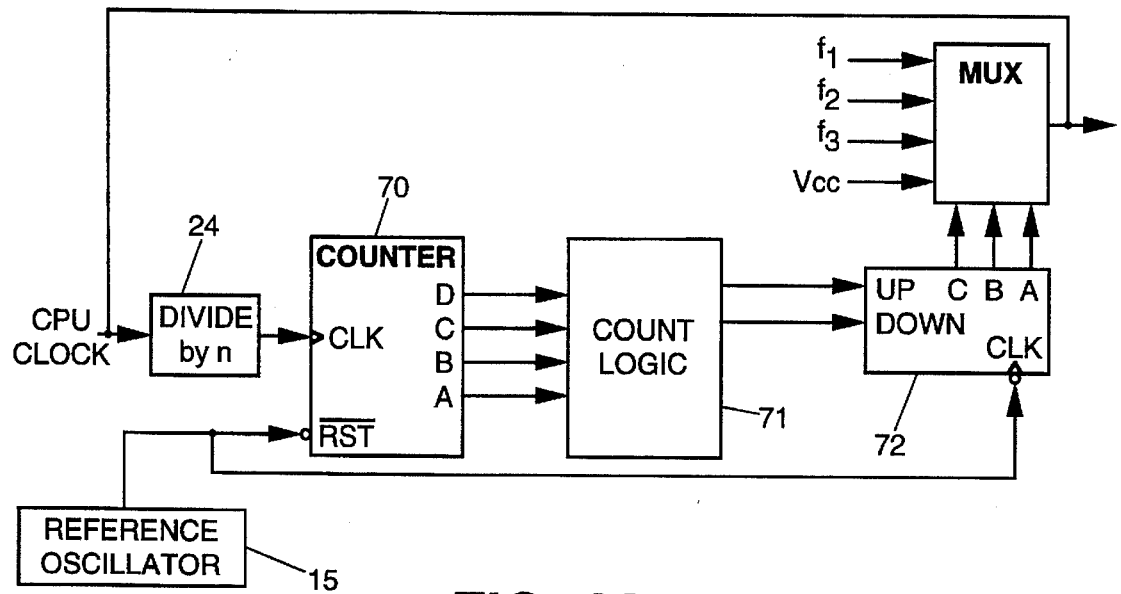
FIGS. 4A and 4B show alternative embodiments of the frequency comparator of the present invention.
Figure 4B:
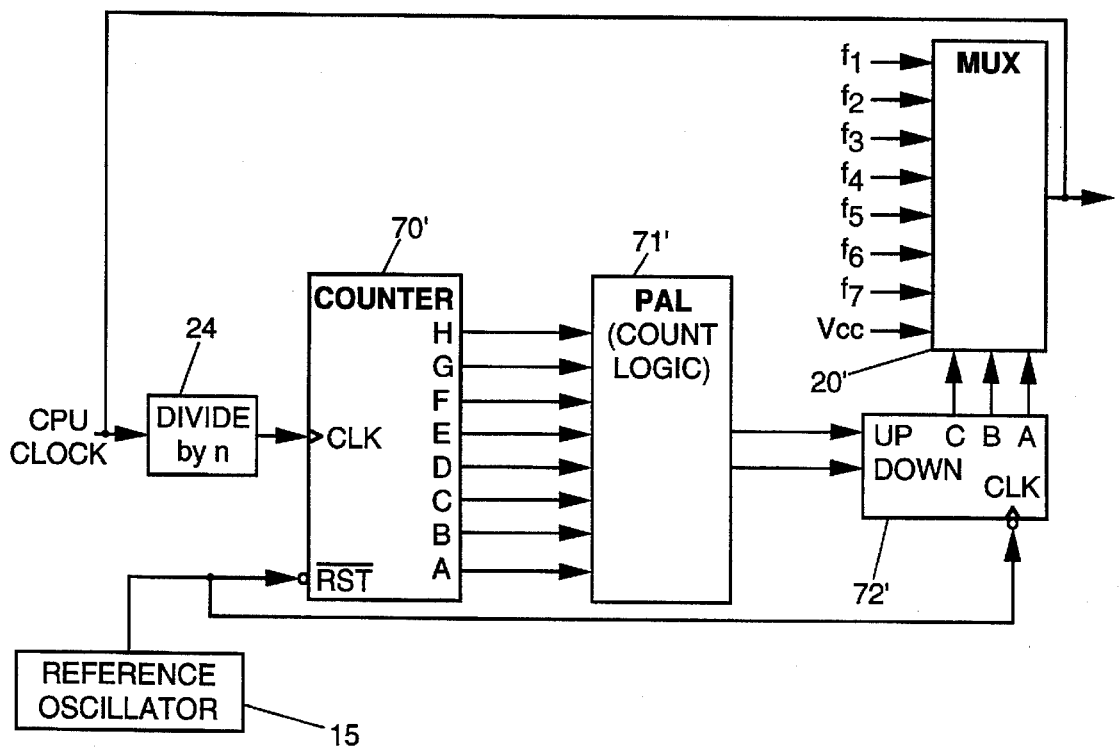

In keeping with the description of the present invention, reference is now made to FIGS. 4A and 4B which show alternative embodiments for the frequency selector 18 of FIG. 1. As previously mentioned, it is contemplated that the present invention may be frequently used in systems where the CPU clock will oscillate at a much higher frequency than the reference oscillator 15. Accordingly, a divider 24 is provided to frequency divide the CPU clock into a value more readily comparable to the output signal of the reference oscillator 15. It is preferred to make the comparison by using a counter 70 to compare the number of oscillations output from divider 24 to the number of oscillations output from reference oscillator 15.

One way of implementing this feature, is to connect the reference oscillator 15 output to a reset line of a counter chip. In this configuration, the output of the counter 70 is zero while the reference oscillator output is low. When, however, the output of reference oscillator 15 is high then the counter 70 will count the oscillations output by divider 24. The output of counter 70 is fed into a logic block 71, which is configured to generate output signals which are used to control a "Select" counter 72 to either count up or count down. More particularly, the transition of the output of reference oscillator 15 from high to low triggers the clock signal of "Select" counter 72. Based upon the signals output from logic block 71 and connected to the count-up and count-down signal lines of counter 72, the counter 72 will either count up, count down or remain the same. As illustrated, the output of counter 72 controls the multiplexer 20, which in turn selects the CPU clock signal. It will be understood that select counter 72 is a synchronous device that is active on the negative-going edge of the output of reference oscillator 15. Between such negative-going transitions, the output of select counter 72 is stable.

To more particularly illustrate this configuration, assume that the CPU clock signal is presently oscillating at 6 times the frequency of the reference oscillator 15. Assume further that it is desired for the CPU clock to oscillate at 8 times the output of the reference oscillator 15, and thus increase in frequency. Further assume that the divider circuit is configured as a "divide-by-two" circuit, whereby its output is oscillating at 3 times the rate of the reference oscillator 15 (6 divided by 2). Since counter 70 is configured to count the oscillations of the divider 24 output for ½ of the period of the reference oscillator 15, as the reference oscillator output transitions from high to low the output of counter 70 would be a 2 (i.e., two positive going pulses detected by counter 70 during the high period of the reference oscillator). Based upon this output, the logic block 71 would instruct the select counter 72 to count up and therefore configure the multiplexer 20 to select the next higher frequency input.

FIG. 4B shows an alternative embodiment to that shown in FIG. 4A, wherein a larger number of oscillating signals $f_1$–$f_7$ are input to multiplexer 20. It is observed that the basic architecture of the circuitry remains the same. An 8-bit counter 70' is substituted for the 4-bit counter 70 of FIG. 4A. The count logic 71, for more complex logic computations, may be implemented by a PAL (programmable array logic) device as opposed to discreet logic devices that would preferably be used for the more simplistic circuit of FIG. 4A. Similarly, select counter 72' provides three select output signals 21 as opposed to two shown in FIG. 4A.

The foregoing description of various preferred embodiments of the invention has been presented for purposes of illustration and description. It is not intended to be exhaustive or to limit the invention to the precise forms disclosed. Obvious modifications or variations are possible in light of the above teachings. The embodiments discussed were chosen and described to provide the best illustration of the principles of the invention and its practical application to thereby enable one of ordinary skill in the art to utilize the invention and various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A circuit for generating a low-power central processing unit (CPU), clock signal comprising:

a multi-frequency oscillator having at least two oscillating output signals, each of the at least two oscillating output signals having a substantially distinct frequency from other ones of the at least two oscillating output signals;

a signal selector disposed to receive the at least two oscillating output signals of the multi-frequency oscillator, the signal selector providing a CPU clock signal based upon a selected one of the at least two oscillating output signals in accordance with an input select signal;

a reference oscillator providing an oscillatory output reference signal;

a frequency selector having as input signals the CPU clock signal and the oscillatory output reference signal, the frequency selector including means for comparing the CPU clock signal frequency and the oscillatory output reference signal frequency, the frequency selector providing an output select signal indicative of the relative frequencies of the oscillatory output reference signal and the CPU clock signal, the output select signal corresponding to the input select signal for selecting one of the at least two oscillating output signals; and an enable signal for selectively enabling the operation of the CPU clock generator.

2. The circuit according to claim 1, wherein the multi-frequency oscillator includes an input signal, the input signal being electrically connected to a feedback signal.

3. The circuit according to claim 2, wherein the feedback signal is the CPU clock signal.

4. The circuit according to claim 2, wherein one of the at least two oscillating output signals is selectively routed to the feedback signal.

5. The circuit according to claim 1, wherein the multi-frequency oscillator includes a plurality of electronically cascaded components configured in a closed-loop path.

6. The circuit according to claim 1, wherein the reference oscillator output signal oscillates at a lower oscillatory frequency than the CPU clock.

7. The circuit according to claim 6, further including a divider circuit, the divider circuit being responsive to the CPU clock signal and operative to provide a divided output signal for selecting, by the frequency selector, one of the at least two oscillating output signals, the divided output signal having an oscillatory frequency lower than the oscillatory frequency of the CPU clock signal.

8. The circuit according to claim 1, wherein the output signal of the frequency selector is directly connected to the input signal of the signal selector.

9. The circuit according to claim 1, wherein the frequency selector includes a bi-directional counter, an output count of the bi-directional counter being representative of the comparison between the CPU clock signal frequency and the oscillatory output reference signal frequency.

10. The circuit according to claim 9, wherein the output count of the bi-directional counter is directly connected to the input select signal of the signal selector.

* * * * *